(12) United States Patent
Sunohara (10) Patent No.: US 10,885,820 B2
(45) Date of Patent: Jan. 5, 2021

(54) PIXEL INSPECTION METHOD, PIXEL INSPECTION DEVICE, AND DISPLAY DEVICE

(71) Applicant: SHARP KABUSHIKI KAISHA, Sakai (JP)

(72) Inventor: Hideaki Sunohara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 268 days.

(21) Appl. No.: 16/182,534

(22) Filed: Nov. 6, 2018

(65) Prior Publication Data

US 2019/0147780 A1    May 16, 2019

(30) Foreign Application Priority Data

Nov. 15, 2017 (JP) .................. 2017-220101

(51) Int. Cl.
*G01R 31/02* (2006.01)
*G01R 31/26* (2020.01)
*G09G 3/00* (2006.01)
*G01R 31/28* (2006.01)
*H01L 21/66* (2006.01)

(52) U.S. Cl.
CPC .............. *G09G 3/006* (2013.01); *G01R 31/26* (2013.01); *G01R 31/2601* (2013.01); *G01R 31/2621* (2013.01); *G01R 31/2642* (2013.01); *G01R 31/2825* (2013.01); *H01L 22/34* (2013.01); *H01L 2924/00* (2013.01); *H01L 2924/0002* (2013.01); *H01L 2924/00014* (2013.01)

(58) Field of Classification Search
CPC ......... H01L 2924/0002; H01L 2924/00; H01L 2924/00014; H01L 22/34; G01R 31/2601; G01R 31/26; G01R 31/2642; G01R 31/2621; G01R 31/2825; G09G 3/006
USPC ...... 324/71, 378, 403, 415, 425, 500, 762.01
See application file for complete search history.

(56) References Cited

U.S. PATENT DOCUMENTS

2004/0141131 A1* 7/2004 Ishikawa .............. G09G 3/3648
                                                       349/139
2018/0122828 A1* 5/2018 Seto ....................... G02F 1/1368
2018/0350285 A1* 12/2018 Goto ........................ G09G 3/006

FOREIGN PATENT DOCUMENTS

JP           2013-178176 A         9/2013

* cited by examiner

*Primary Examiner* — Raul J Rios Russo
(74) *Attorney, Agent, or Firm* — ScienBiziP, P.C.

(57) ABSTRACT

Provided is a method of inspecting pixels. The method includes the step of applying a switching signal to gate electrodes of inspection transistors and the step of applying an inspection data signal to one or more of source electrodes of the inspection transistors. A voltage applied to the gate electrodes is controlled under the switching signal and the inspection data signal.

7 Claims, 7 Drawing Sheets

FIG. 5
SUBSTRATE INSPECTION DEVICE OF COMPARATIVE EMBODIMENT

PIXEL INSPECTION METHOD, PIXEL INSPECTION DEVICE, AND DISPLAY DEVICE

This Nonprovisional application claims priority under 35 U.S.C. § 119 on Patent Application No. 2017-220101 filed in Japan on Nov. 15, 2017, the entire contents of which are hereby incorporated by reference.

TECHNICAL FIELD

The present invention relates to a method of inspecting pixels of a display device, and an inspection device for conducting such inspection.

BACKGROUND ART

To inspect pixels of a display device which is difficult to be equipped with an inspection circuit outside a panel, the ASL inspection system is sometimes employed. Patent Literature 1 discloses a method in which the ASL inspection system is employed to detect pixel defects of a display device.

CITATION LIST

Patent Literature

[Patent Literature 1]
Japanese Patent Application Publication Tokukai No. 2013-178176 (Publication date: Sep. 9, 2013)

SUMMARY OF INVENTION

Technical Problem

According to the ASL inspection system, pixel inspection is conducted by turning on a switching element (such as an ASL transistor) so that an inspection signal is inputted to a pixel signal line connected to the transistors provided corresponding to pixels, the switching element being provided for each signal line of a display device. Control of the switching element usually requires a signal having a high voltage of approximately 20 V to 30 V to be applied to the switching signal line connected to the switching element. Therefore, pixel inspection based on the ASL inspection system unfortunately consumes a large amount of electric power.

Solution to Problem

In order to attain the above object, a method of inspecting pixels of a display device in accordance with an embodiment of the present invention is a method of inspecting pixels of a display device by controlling one or more of inspection transistors connected to respective ones of pixel signal lines of the display device so that an inspection data signal is inputted to one or more of the pixel signal lines, the method including the steps of: applying a switching signal to gate electrodes of the inspection transistors; and applying the inspection data signal to one or more of source electrodes of the inspection transistors, wherein a voltage applied to the gate electrodes is controlled under the switching signal and the inspection data signal.

In order to attain the above object, a pixel inspection device in accordance with an embodiment of the present invention is a pixel inspection device for inspecting pixels of a display device through input of an inspection data signal to one or more of pixel signal lines of the display device, the pixel inspection device including: inspection transistors whose drain electrodes are connected to respective ones of the pixel signal lines; a switching signal line connected to gate electrodes of the inspection transistors; and inspection signal lines connected to source electrodes of the inspection transistors, wherein a voltage applied to the gate electrodes is controlled under (i) a switching signal applied to the switching signal line and (ii) the inspection data signal applied to the inspection signal lines.

Advantageous Effects of Invention

According to an embodiment of the present invention, voltage applied to the gate electrode of an inspection transistor can be controlled with use of not only a switching signal but also an inspection data signal. This allows a reduction in voltage of a signal necessary for the control of the inspection transistor, and consequently allows reduction in electric power consumed in pixel inspection.

DESCRIPTION OF EMBODIMENTS

Embodiment 1

Figure 2:
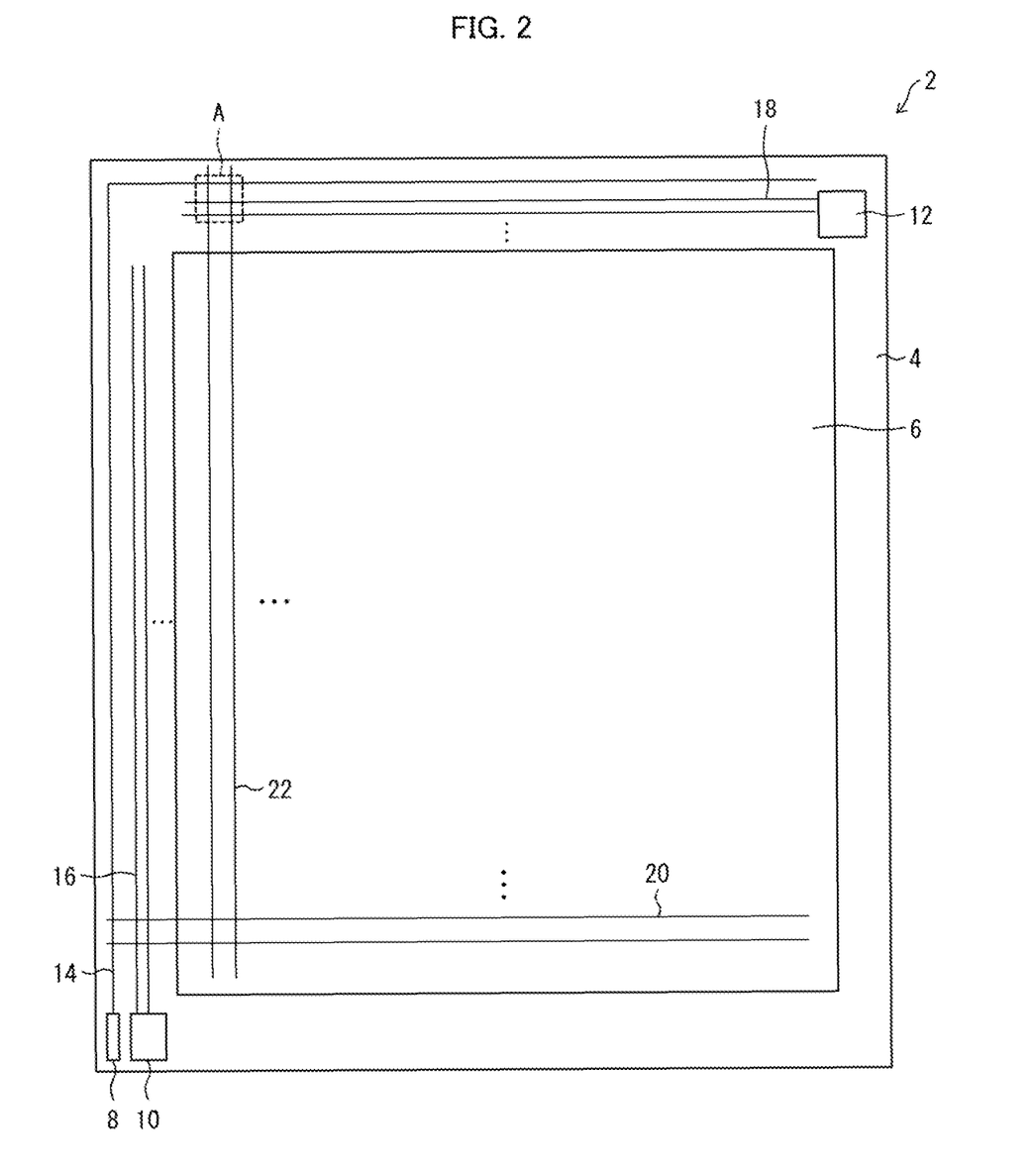
FIG. 2 is a top view of a display device in accordance with Embodiment 1 of the present invention.

FIG. 2 is a top view of a display device 2 in accordance with Embodiment 1. The display device 2 in accordance with Embodiment 1 includes a pixel inspection device 4 and a display panel 6. The pixel inspection device 4 is provided so as to surround the display panel 6. The display panel 6 includes (i) a plurality of pixels arranged in a matrix and (ii) a plurality of transistors, provided so as to correspond one-to-one to the plurality of pixels, for driving the pixels.

The pixel inspection device 4 includes a switching driver 8, an inspection signal driver 10 for gate lines, and an inspection signal driver 12 for source lines. To the switching driver 8, a switching signal line 14 is connected. To the inspection signal driver 10, inspection signal lines 16 for gate lines are connected. To the inspection signal driver 12, inspection signal lines 18 for source lines are connected.

The switching signal line 14 is provided along and across two sides of the display panel 6 which are adjacent to each other. The inspection signal lines 16 are provided along one of the two sides of the display panel 6, along which two sides the switching signal line 14 is provided, and the inspection signal lines 18 are provided along the other of the two sides of the display panel 6. Although FIG. 2 illustrates only two inspection signal lines 16 for gate lines and two inspection signal lines 18 for source lines, the pixel inspection device 4 can include three or more inspection signal lines 16 for gate lines and three or more inspection signal lines 18 for source lines.

The inspection signal lines 16 are connected to gate signal lines 20 of the display panel 6. The inspection signal lines 18 are connected to source signal lines 22 of the display panel 6. The gate signal lines 20 are pixel signal lines that are connected to the gate electrodes of the transistors provided for the respective pixels of the display panel 6. The source signal lines 22 are pixel signal lines that are connected to the source electrodes of the transistors provided for the respective pixels of the display panel 6. The gate signal lines 20 are connected to a gate driver (not illustrated) of the display panel 6. The source signal lines 22 are connected to a source driver (not illustrated) of the display panel 6. The gate driver and the source driver are used for the control of the transistors of the display panel 6, i.e., for the control of display of the display panel 6.

Note that the pixel inspection device 4 is configured not to input any signal to the gate signal lines 20 and the source signal lines 22 when the display device 2 is in actual use. Although the display device 2 in accordance with Embodiment 1 includes the pixel inspection device 4, the substrate on which the pixel inspection device 4 is provided can be, in practice, cut and discarded before shipping of the display device 2.

Figure 1:
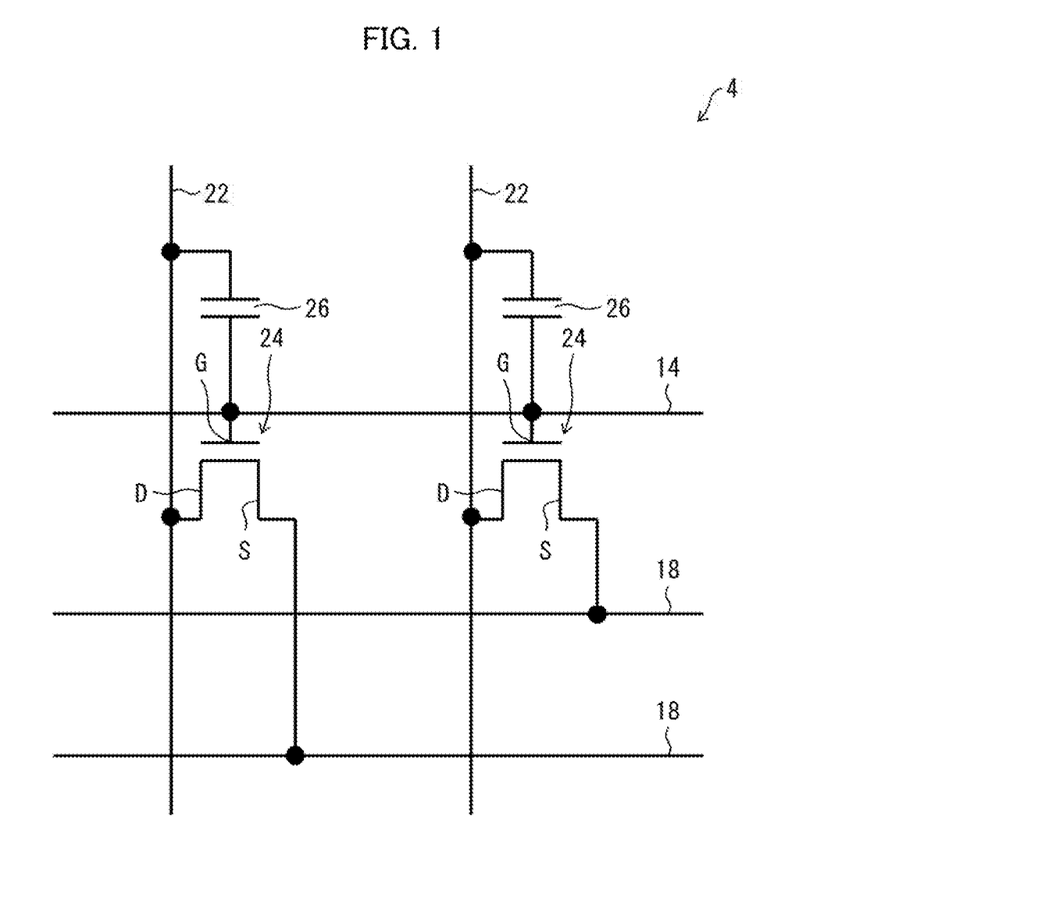
FIG. 1 is an equivalent circuit diagram illustrating part of a pixel inspection device in accordance with Embodiment 1 of the present invention.

The following description will specifically discuss, with reference to FIG. 1, the relationship among (i) the switching signal line 14, (ii) the inspection signal lines 16 and the inspection signal lines 18, and (iii) the gate signal lines 20 and the source signal lines 22. FIG. 1 is an equivalent circuit diagram illustrating part of the pixel inspection device 4, i.e., the region A illustrated in FIG. 2, in an enlarged view.

As illustrated in FIG. 1, the pixel inspection device 4 includes inspection transistors 24 provided corresponding one-to-one to the source signal lines 22. The inspection transistors 24 include their respective drain electrodes D, source electrodes S, and gate electrodes G. The drain electrodes D, the source electrodes and the gate electrodes G are connected to the corresponding source signal lines 22, the corresponding inspection signal lines 18 for source lines, and the switching signal line 14, respectively. Note that the source electrodes S of the inspection transistors 24 can be connected to different inspection signal lines 18 for source lines.

The pixel inspection device 4 also includes capacitors 26 provided corresponding one-to-one to the source signal lines 22. Each of the capacitors 26 is provided between (i) the switching signal line 14 to which the gate electrodes G are connected and (ii) the corresponding one of the source signal lines 22 to which the drain electrodes D are connected.

FIG. 1 illustrates only a region, in the pixel inspection device 4, where the inspection signal lines 18 and the source signal lines 22 are arranged. In the pixel inspection device 4, such an arrangement also applies to a region where the inspection signal lines 16 and the gate signal lines 20 are arranged.

Figure 3:
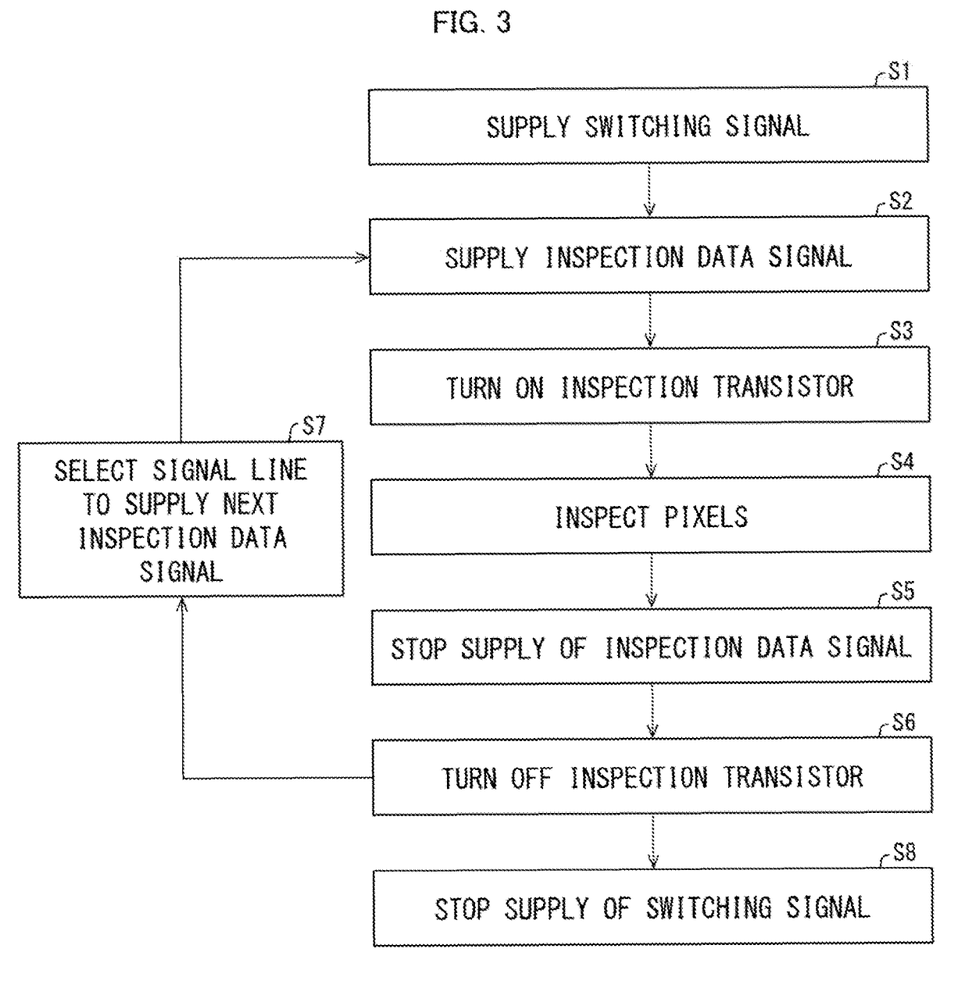
FIG. 3 is a flowchart illustrating a pixel inspection method in accordance with Embodiment 1 of the present invention.
Figure 4:
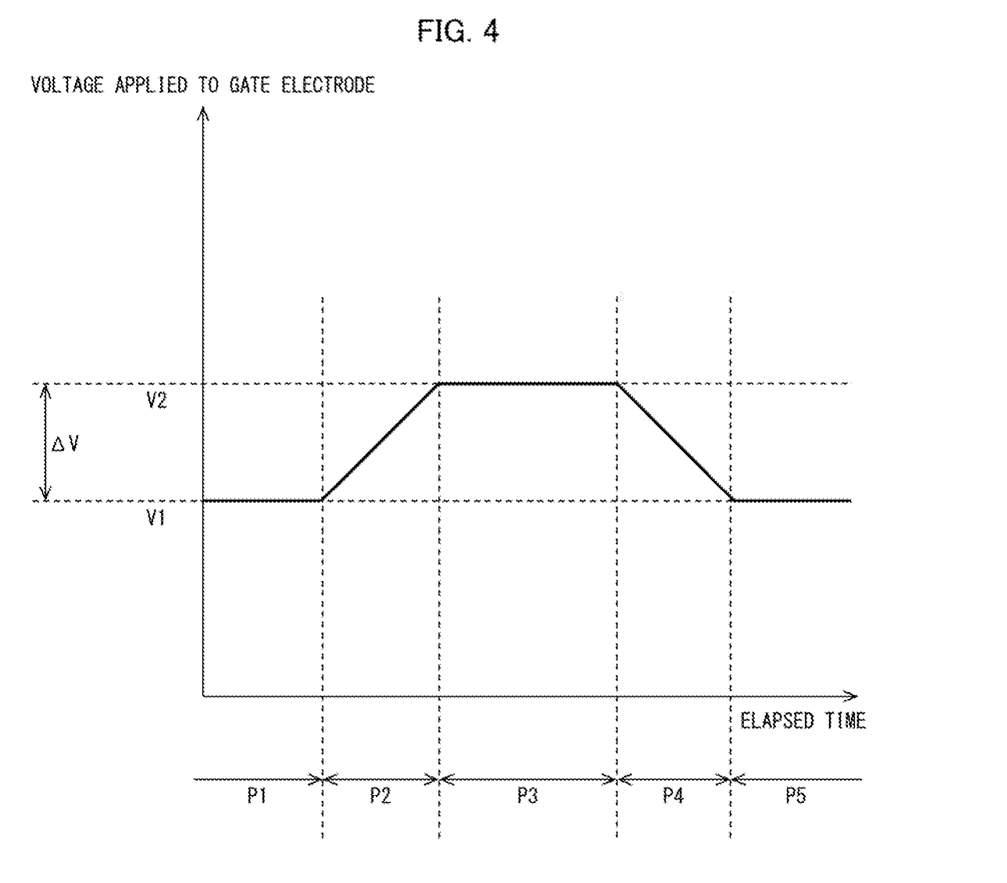
FIG. 4 is a graph illustrating how the signal voltage applied to the gate electrode of an inspection transistor changes over time during pixel inspection carried out by the pixel inspection method in accordance with Embodiment 1 of the present invention.

Next, the following description will discuss, with reference to FIGS. 3 and 4, how the pixels of the display device 2 are inspected with use of the pixel inspection device 4 in accordance with Embodiment 1. FIG. 3 is a flowchart illustrating a pixel inspection method in accordance with Embodiment 1. FIG. 4 is a graph illustrating how the signal voltage applied to the gate electrode G changes over time during pixel inspection carried out by the pixel inspection method in accordance with Embodiment 1.

Note that V1 indicated in FIG. 4 represents the effective voltage of a switching signal supplied to the switching signal line 14. V2 indicated in FIG. 4 represents the turn-on voltage of the inspection transistor 24. More specifically, V2 is the voltage of a switching signal of the inspection transistor 24. That is, in order for a signal having been supplied to the inspection signal line 18 and flowing to the source signal line 22 via the inspection transistor 24 to have a voltage that surpasses the voltage at which pixel inspection can be conducted, the voltage of a switching signal applied to the inspection transistor 24 needs to become equal to or higher than V2. ΔV represents the difference between V1 arid V2

The process of inspecting the display device 2 in accordance with Embodiment 1 can be performed after (i) each component of the display panel 6 is produced and (ii) the pixel inspection device 4 is mounted around the display panel 6. In the inspection process, the switching driver 8 is first used to supply, to the switching signal line 14, a switching signal having an effective voltage of V1 (step S1).

Subsequently, the inspection signal driver 12 is used to supply an inspection data signal to any of the inspection signal lines 18 for source lines (step S2). In so doing, the inspection data signal can be supplied to one or more of the inspection signal lines 18 for source lines. A first time period P1 indicated in FIG. 4 represents a time period, from when the switching signal is supplied to the switching signal line 14, until the inspection data signal is supplied to the inspection signal line 18.

The operation in the step S2 causes the inspection data signal to be applied to the source electrode S of the inspection transistor 24. At this point in time, the switching signal having a voltage of V1 has been applied to the gate electrode G of the inspection transistor 24. In this state, although the resistance in the channel of the inspection transistor 24 is still high, part of the signal having been applied to the source electrode S passes through the channel and is supplied through the drain electrode D to a corresponding source signal line 22. Note that, at this point in time, an inspection data signal having a voltage necessary for pixel inspection has not necessarily been supplied to the source signal line 22.

Since the capacitor 26 is provided between the source signal line 22 and the gate electrode G, the capacitor 26 is gradually charged by the inspection data signal which has been supplied to the source signal line 22 by the operation in the step S2. It follows that, in addition to the voltage of the switching signal supplied to the switching signal line 14, the voltage from the capacitor 26 is applied to the gate electrode G. This causes the signal voltage applied to the gate electrode G to exceed V1 and reach V2. Consequently, the signal having a voltage of V2 is applied to the gate electrode G of the inspection transistor 24, and thus the inspection transistor 24 is turned on (step S3). A second time period P2 indicated in FIG. 4 represents a time period, from when the inspection data signal is supplied to the inspection signal line 18, until the inspection transistor 24 is turned on.

When the inspection transistor 24 is turned on, the resistance in the channel of the inspection transistor 24 decreases.

This causes the inspection data signal having been supplied to the inspection signal line 18 to flow more to the source signal line 22 via the inspection transistor 24. The inspection data signal supplied to the source signal line 22 at this stage has a voltage necessary for pixel inspection.

In Embodiment 1, as in the step S2, the inspection signal driver 10 is used to supply an inspection data signal to any of the inspection signal lines 16 for gate lines. Therefore, based on the same principle as that discussed earlier, an inspection data signal having a voltage necessary for pixel inspection is also supplied to a gate signal line 20.

With the above configuration, the inspection data signals are inputted separately to the gate electrode and the source electrode of the transistor corresponding to the pixel located at the intersection between the gate signal line 20 and the source signal line 22 to which the inspection data signals have been supplied separately. This makes it possible to drive the transistor corresponding to the pixel and consequently to inspect the pixel (step S4). Note that the pixel inspection can be a pixel lighting test or any other inspections carried out by the conventionally-known methods in which the transistors corresponding to the pixels are driven.

After the inspection of the pixel is completed, supply of the inspection data signal to the inspection signal line 18 is stopped (step S5). This causes the voltage of the inspection data signal supplied to the source signal line 22 to decrease, and in turn causes the capacitor 26 to start discharging. Consequently, the voltage of the signal applied to the gate electrode G of the inspection transistor 24 decreases below V2, and thus the inspection transistor 24 is turned off (step S6). The decrease in voltage of the signal applied to the gate electrode G continues until it decreases to V1.

A third time period P3 indicated in FIG. 4 represents a time period in which the inspection transistor 24 is being turned on. A fourth time period P4 indicated in FIG. 4 represents a time period, from when the supply of the inspection data signal to the inspection signal line 18 is stopped, until the voltage of the signal applied to the gate electrode G decreases from V2 to V1. A fifth time period P5 indicated in FIG. 4 represents a time period after the voltage of the signal applied to the gate electrode G decreased to V1.

Subsequently, another inspection signal line 18 for source lines is selected to supply a next inspection data signal (step S7), arid the step S2 is carried out again. Then, the steps S2 to S7 are performed until all the pixels of the display panel 6 are inspected. The same procedure is followed for the inspection signal lines 16 and the gate signal lines 20. After all the pixels of the display panel 6 are inspected, supply of the switching signal to the switching signal line 14 is stopped (step S8), and thus the entire process of pixel inspection is completed.

In Embodiment 1, the inspection data signal, which is supplied to the inspection signal line 18 and then to the source signal line 22 via the inspection transistor 24, is also supplied to the capacitor 26 provided between the source signal line 22 and the gate electrode G. The inspection data signal thus supplied to the capacitor 26 increases the voltage of the signal applied to the gate electrode G. As such, according to the method of inspecting the pixels of the display device 2 in accordance with Embodiment 1, a voltage applied to the gate electrode G can be controlled with use of not only the switching signal supplied to the switching signal line 14 but also the inspection data signal.

It is therefore unnecessary to supply, to the switching signal line 14, a switching signal having a voltage of V2 (i.e., turn-on voltage). To the switching signal line 14, it is only necessary to supply a switching signal having a voltage of V1, which is lower than V2 by ΔV. Even in such a case, the pixels of the display panel 6 can be inspected during the third time period P3 indicated in FIG. 4. The voltage of a switching signal to be supplied to the switching signal line 14 is therefore reduced by ΔV. This makes it possible to inspect the pixels of the display device 2 with less electric power consumption as compared with conventional techniques.

Figure 5:
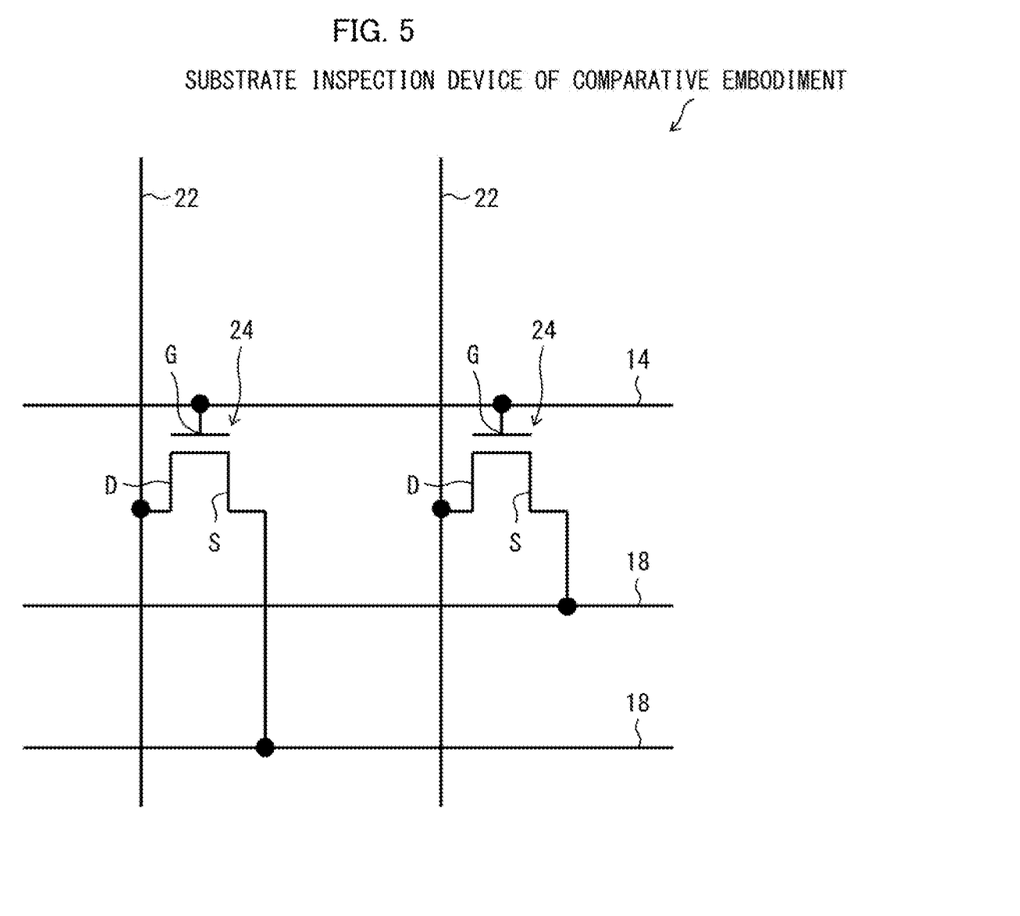
FIG. 5 is an equivalent circuit diagram illustrating part of a pixel inspection device in accordance with a comparative embodiment.

FIG. 5 is an equivalent circuit diagram illustrating part of a pixel inspection device in accordance with a comparative embodiment in an enlarged view. This part corresponds to the region illustrated in FIG. 1. In the comparative embodiment, no capacitor 26 is provided. Therefore, in order to turn on inspection transistors 24, it is necessary to supply a switching signal having an effective voltage of V2 to a switching signal line 14 throughout the entire inspection process. This causes an increase in electric power consumed in the process of inspecting pixels of a display device.

Embodiment 2

Figure 6:
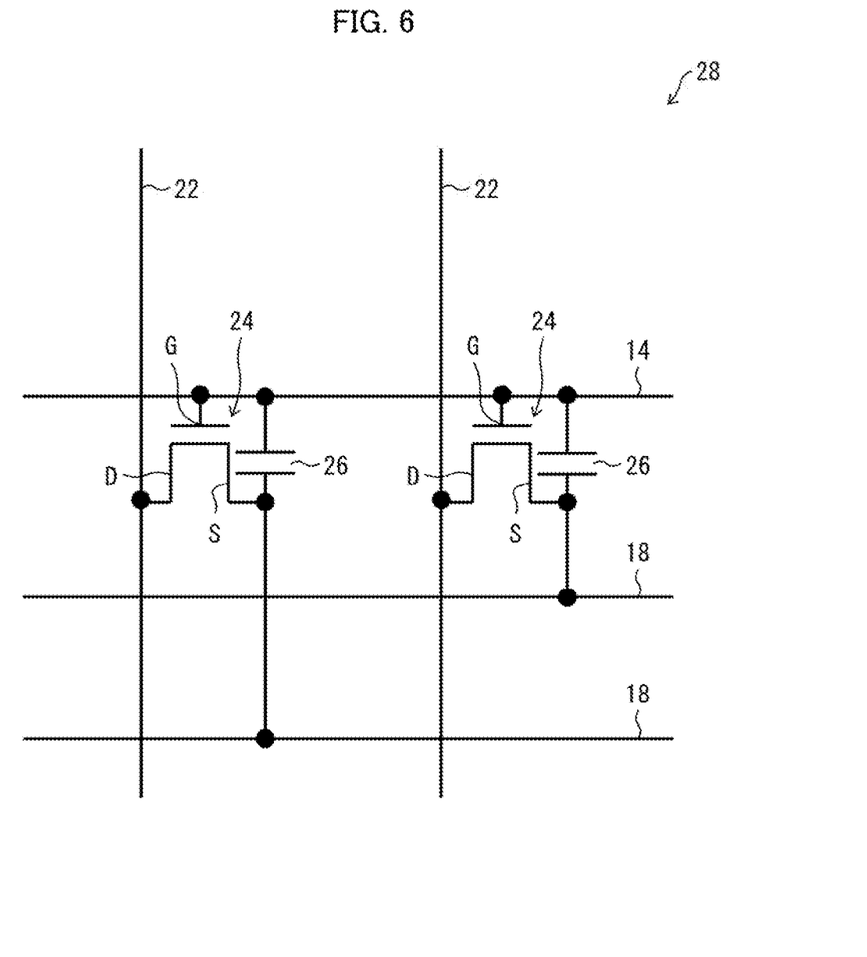
FIG. 6 is an equivalent circuit diagram illustrating part of a pixel inspection device in accordance with Embodiment 2 of the present invention.

FIG. 6 is an equivalent circuit diagram illustrating part of a pixel inspection device 28 in accordance with Embodiment 2 in an enlarged view. This part corresponds to the region illustrated in FIG. 1. The pixel inspection device 28 in accordance with Embodiment 2 differs from the pixel inspection device 4 in accordance with Embodiment 1 only in that a capacitor 26 is provided between a source electrode S and a gate electrode G of an inspection transistor 24.

Figure 7:
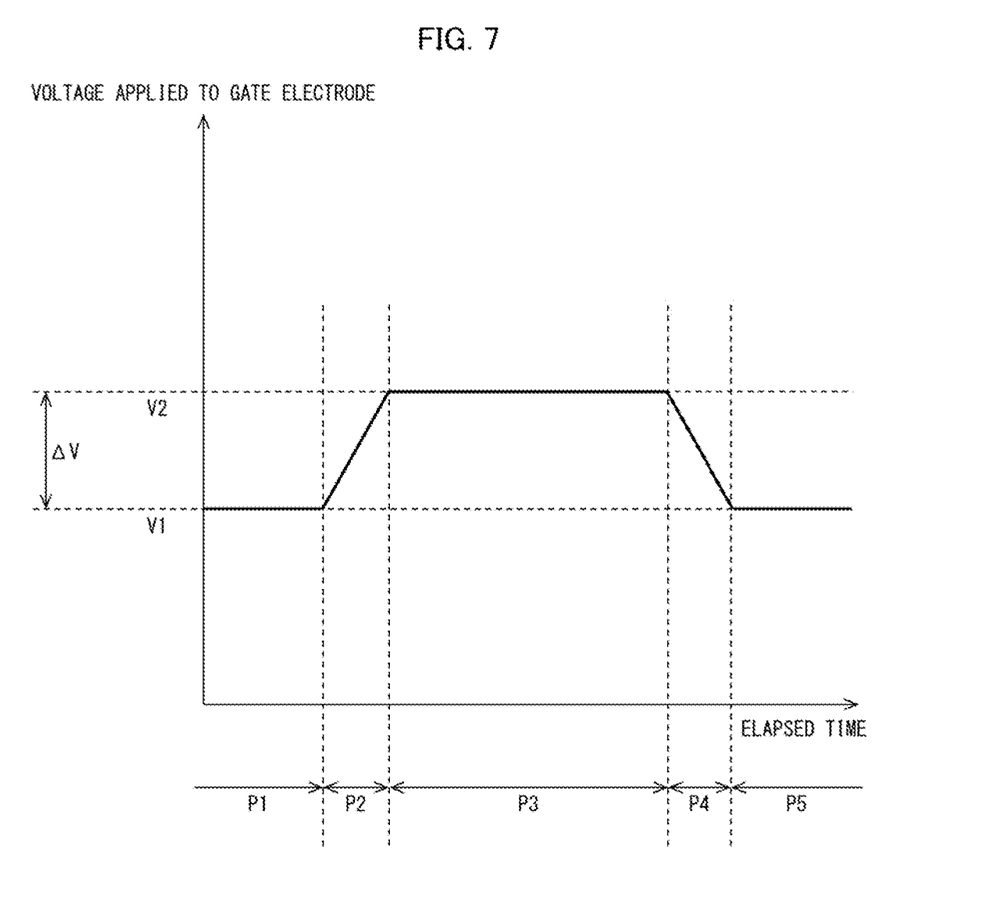
FIG. 7 is a graph illustrating how the signal voltage applied to the gate electrode of an inspection transistor changes over time during pixel inspection carried out by the pixel inspection method in accordance with Embodiment 2 of the present invention.

In Embodiment 2, the process of inspecting pixels of a display device 2 is also performed by carrying out the steps S1 to S8 illustrated in the flowchart of FIG. 3. FIG. 7 is a graph illustrating how the signal voltage applied to a gate electrode changes over time during pixel inspection carried out the pixel inspection method in accordance with Embodiment 2. First to fifth time periods P1 to P5 indicated in FIG. 7 correspond to the first to fifth time periods P1 to P5 indicated in FIG. 4, respectively.

Embodiment 2 differs from Embodiment 1 in that the second time period P2 is shorter in Embodiment 2 than in Embodiment 1. Specifically, the time period, from when supply of an inspection data signal to any of inspection signal lines 18 for source lines is started, until the signal voltage applied to the gate electrode G reaches V2 is shorter in Embodiment 2 than in Embodiment 1. This is because, in Embodiment 2, part of the inspection data signal is directly charged into the capacitor 26 without passing through the channel of the inspection transistor 24. This accelerates an increase in signal voltage applied to the gate electrode G.

The fourth time period P4 is also shorter in Embodiment 2 than in Embodiment 1. Specifically, the time period, from when the step S4 is completed and the supply of the inspection data signal to the inspection signal line 18 is stopped, until the signal voltage applied to the gate electrode G is decreased to V1 is shorter in Embodiment 2 than in Embodiment 1. This is because, in Embodiment 2, the capacitor 26 promptly discharges via the inspection signal line 18, which is lower in resistance than a source signal line 22 to which the transistors and the pixel capacitance of pixels are connected.

In Embodiment 2, the capacitor 26 via which a voltage applied to the gate electrode G is controlled under the inspection data signal is provided between the source electrode S and the gate electrode G. This makes it possible to shorten the second and fourth time periods P2 and P4, and consequently makes it possible to shorten the inspection time. It is therefore possible to (i) further reduce electric power consumed in the process of inspecting the pixels of the display device 2 and (ii) reduce the task time of the process of producing the display device 2.

Moreover, since no capacitance is formed between the source signal line 22 and the gate electrode G, it is possible to reduce the possibility that an error occurs during inspection due to insufficient charging to the pixel capacitance of a pixel of the display panel 6. This allows a further enhancement in production yield of the display device 2.

[Recap]

A method of inspecting pixels of a display device in accordance with a first aspect of the present invention is a method of inspecting pixels of a display device by controlling one or more of inspection transistors connected to respective ones of pixel signal lines of the display device so that an inspection data signal is inputted to one or more of the pixel signal lines, the method including the steps of: applying a switching signal to gate electrodes of the inspection transistors; and applying the inspection data signal to one or more of source electrodes of the inspection transistors, wherein a voltage applied to the gate electrodes is controlled under the switching signal arid the inspection data signal.

According to the above configuration, a voltage applied to the gate electrodes is controlled with use of not only the switching signal but also the inspection data signal. This allows a reduction in voltage of the switching signal. It is therefore possible to reduce electric power consumed in the process of inspecting pixels of a display device.

The method in accordance with a second aspect of the present invention can be configured such that, in the first aspect of the present invention, the voltage applied to the gate electrodes is controlled by forming capacitance between each of the gate electrodes and each of the pixel signal lines.

According to the above configuration, the capacitance can be charged by the inspection data signal which has been supplied to the one or more of the pixel signal lines via the channel(s) of the one or more of the inspection transistors. The capacitance then causes an increase in voltage at the gate electrodes. This makes it possible to reduce the voltage of the switching signal.

The method in accordance with a third aspect of the present invention can be configured such that, in the first aspect of the present invention, the voltage applied to the gate electrodes is controlled by forming capacitance between each of the gate electrodes and each of the source electrodes.

According to the above configuration, (i) the inspection data signal applied to one or more of the source electrodes is directly charged into the capacitance without via the inspection transistor(s), and (ii) the capacitance is discharged without via the one or more of the pixel signal lines which have high resistance. This makes it possible to more rapidly control the voltage applied to the gate electrode(s). In a case where no capacitance is formed between the gate electrode(s) and the pixel signal line(s), it is possible to reduce the possibility of insufficient charging of the inspection data signal to the pixel capacitance.

A pixel inspection device in accordance with a fourth aspect of the present invention is a pixel inspection device for inspecting pixels of a display device through input of an inspection data signal to one or more of pixel signal lines of the display device, the pixel inspection device including: inspection transistors whose drain electrodes are connected to respective ones of the pixel signal lines; a switching signal line connected to gate electrodes of the inspection transistors; and inspection signal lines connected to source electrodes of the inspection transistors, wherein a voltage applied to the gate electrodes is controlled under (i) a switching signal applied to the switching signal line and (ii) the inspection data signal applied to the inspection signal lines.

The above configuration brings about the same effect as that brought about by the first aspect of the present invention.

The pixel inspection device in accordance with a fifth aspect of the present invention is configured such that, in the fourth aspect of the present invention, capacitors are provided between the gate electrodes and the respective ones of the pixel signal lines.

The above configuration brings about the same effect as that brought about by the second aspect of the present invention.

The pixel inspection device in accordance with a sixth aspect of the present invention is configured such that, in the fourth aspect of the present invention, capacitors are provided between the gate electrodes and the source electrodes.

The above configuration brings about the same effect as that brought about by the third aspect of the present invention.

A display device in accordance with a seventh aspect of the present invention includes a pixel inspection device in accordance with any one of the fourth to sixth aspects of the present invention.

The above configuration makes it possible to provide a display device which can be produced with smaller power consumption.

The present invention is not limited to the embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

REFERENCE SIGNS LIST

2: Display device
4, 28: Pixel inspection device
14: Switching signal line
16: Inspection signal line for gate lines
18: Inspection signal line for source lines
20: Gate signal line (pixel signal line)
22: Source signal line (pixel signal line)
24: Inspection transistor
26: Capacitor
D: Drain electrode
G: Gate electrode
S: Source electrode

The invention claimed is:

1. A method of inspecting pixels of a display device by controlling one or more of inspection transistors connected to respective ones of pixel signal lines of the display device so that an inspection data signal is inputted to one or more of the pixel signal lines, the method comprising the steps of:
　　applying a switching signal to gate electrodes of the inspection transistors; and
　　applying the inspection data signal to one or more of source electrodes of the inspection transistors,
　　wherein a voltage applied to the gate electrodes is controlled under the switching signal and the inspection data signal.

2. The method as set forth in claim 1, wherein the voltage applied to the gate electrodes is controlled by forming capacitance between each of the gate electrodes and each of the pixel signal lines.

3. The method as set forth in claim 1, wherein the voltage applied to the gate electrodes is controlled by forming capacitance between each of the gate electrodes and each of the source electrodes.

4. A pixel inspection device for inspecting pixels of a display device through input of an inspection data signal to one or more of pixel signal lines of the display device, the pixel inspection device comprising:
- inspection transistors whose drain electrodes are connected to respective ones of the pixel signal lines;
- a switching line connected to gate electrodes of the inspection transistors; and
- inspection signal lines connected to source electrodes of the inspection transistors,
- wherein a voltage applied to the gate electrodes is controlled under (i) a switching signal applied to the switching signal line and (ii) the inspection data signal applied to the inspection signal lines.

5. The pixel inspection device as set forth in claim 4, wherein capacitors are provided between the gate electrodes and the respective ones of the pixel signal lines.

6. The pixel inspection device as set forth in claim 4, wherein capacitors are provided between the gate electrodes and the source electrodes.

7. A display device comprising the pixel inspection device recited in claim 4.

\* \* \* \* \*